(12) United States Patent
Leonardsson

(10) Patent No.: US 7,060,521 B2
(45) Date of Patent: Jun. 13, 2006

(54) BONDING METHOD

(75) Inventor: Lars Leonardsson, Danderyd (SE)

(73) Assignee: Micronic Laser Systems AB, Taby (SE)

( * ) Notice: Subject to any disclaimer, the term of this patent is extended or adjusted under 35 U.S.C. 154(b) by 86 days.

(21) Appl. No.: 10/488,353

(22) PCT Filed: Sep. 16, 2002

(86) PCT No.: PCT/SE02/01656

§ 371 (c)(1),
(2), (4) Date: Sep. 1, 2004

(87) PCT Pub. No.: WO03/025986

PCT Pub. Date: Mar. 27, 2003

(65) Prior Publication Data

US 2005/0002596 A1    Jan. 6, 2005

(30) Foreign Application Priority Data

Sep. 20, 2001 (SE) ................................. 0103134

(51) Int. Cl.
*H01L 21/00* (2006.01)
(52) U.S. Cl. .......................................... 438/52; 438/48
(58) Field of Classification Search ................ None
See application file for complete search history.

(56) References Cited

U.S. PATENT DOCUMENTS

| 5,241,211 A | 8/1993 | Tashiro |
| 5,415,726 A | 5/1995 | Staller et al. |
| 6,201,631 B1 | 3/2001 | Greywall |
| 6,452,712 B1 * | 9/2002 | Atobe et al. ................ 359/291 |

OTHER PUBLICATIONS

Foreign search report.

* cited by examiner

*Primary Examiner*—Luan Thai
(74) *Attorney, Agent, or Firm*—Harness, Dickey & Pierce, P.L.C.

(57) ABSTRACT

The present invention relates to a method to form an integrated device, said device comprising a first substrate and at least one element provided on a second substrate. A bonding material is arranged on at least one of said substrates. Said first and second substrates are joined together. At least one recess is provided through at least said first substrate and said material. Support structures are provided in at least a part of said at least one recess to mechanically and/or electrically interconnect said at least one element on said second substrate and said first substrate. At least one element out of said first substrate is formed to be mechanically and/or electrically connectable to said at least one support structure. At least a portion of said material between said first and second substrates is stripped away to make said element on said first substrate movable.

24 Claims, 6 Drawing Sheets

BONDING METHOD

TECHNICAL FIELD

The present invention relates in general to techniques for forming an integrated device, e.g. a semiconductor device, and in particular to a low temperature method for forming said integrated circuit.

DESCRIPTION OF THE BACKGROUND ART

For example, it is well known in the current art to build spatial light modulators (SLM) of a micro mirror type U.S. Pat. No. 4,566,935, U.S. Pat. No. 4,710,732, U.S. Pat. No. 4,956,619. In general two main principles for building integrated devices, such as micromirror SLM, have been employed.

An integrated circuit (IC) is manufactured to a finished state, and then the micro mirrors are manufactured on said IC. The micro mirrors are built onto the IC wafers. An advantage with this approach is that, so called, IC foundries can be used, which presents a very cost efficient manufacturing of the electronics wafers. A disadvantage is that there is a very restricted selection of materials and methods that are usable for the manufacturing of the micromirrors, because there is an upper temperature limit of about 400° C., above which the electronics will be damaged. This makes the manufacturing of micromirrors having optimal performance more difficult.

Another way of building micromirror SLMs is at the end of the process for making the IC, micromirror manufacture is started on the same wafers. The advantage with this approach is that there is a greater freedom of selecting materials, methods and temperatures for the manufacture of micromirrors having good performance. A disadvantage is that the IC wafers cannot be manufactured in standard IC foundries, because the latter have very strict demands on a process of manufacturing to be standardized in order to be able to maintain the quality in the process.

Therefore, there is a need in the art for an improved method for manufacturing micro electric/mechanical/optical integrated devices.

SUMMARY OF THE INVENTION

In view of the foregoing background, the method for manufacturing integrated devices, such as for example micromirror SLMs, is critical for the performance of such devices.

Accordingly, it is an object of the present invention to provide an improved manufacturing method for an integrated device which overcomes or at least reduces the above mentioned disadvantages.

In a first embodiment, the invention provides a method to form an integrated device, said device comprising a first substrate and at least one element provided on a second substrate. A layer of material is arranging on at least a portion of one of said substrates. Said first and second substrates are joined together. At least one recess is provided through at least said first substrate and said material. At least one support structures is provided in at least a part of said at least one recess to mechanically and/or electrically interconnect said at least one element on said second substrate and said first substrate. At least one element is formed out of said first substrate to be mechanically and/or electrically connectable to said at least one support structure. At least a portion of said material between said first and second substrates is stripped away to make said element on said first substrate movable.

In another embodiment of the invention said first and second substrates are joined together by means of bonding.

In still another embodiment of the invention said first and second substrates are joined together by means of riveting.

In yet another embodiment of the invention said first and second substrates are joined together by means of bolted joint, external fixture, flip chip bonding, capillary wedge bonding or ultrasonic bonding.

In yet another embodiment said invention, further comprising the action of removing a portion of the thickness of the first substrate.

In yet another embodiment said invention further comprising the action of arranging a metal layer on at least one surface of said first substrate prior to joining said first and second substrates together.

In yet another embodiment said invention further comprising the action of doping at least a portion of said first substrate made of semiconducting material prior to joining said first substrate and second substrate together.

In yet another embodiment said invention further comprising the action of providing at least one additional layer of stress compensating material on said first substrate.

In yet another embodiment of the invention said stress compensating material is at least one of the materials of: silicon oxide, silicon nitride or metal.

In yet another embodiment of the invention said support structure is made of electrically non conducting material.

In yet another embodiment of the invention said support structure is made of electrically conducting material.

In yet another embodiment of the invention said first substrate and said second substrate are secured to each other by one of the group of: evaporation, spin coating, sputtering, plating, riveting, soldering, gluing, capillary flow, screen printing, Chemical Vapor Deposition, epitaxial growth, capillary flow.

In yet another embodiment of the invention said bonding material is a low temperature adhesive, e.g. a polymer selected from poly-imide, bensocyclobutene (BCB), epoxy, photoresist.

In yet another embodiment of the invention said bonding material is a metal, semiconducting or dielectric material.

In yet another embodiment of the invention said at least one element formed out of said first substrate is a micro mirror.

In yet another embodiment of the invention said at least one element formed out of said first substrate is made of a single crystal material, amorphous material or nanocrystalline material.

In yet another embodiment of the invention said material is semiconducting.

In yet another embodiment of the invention said at least one element provided on said second substrate is an integrated circuit.

In yet another embodiment of the invention said integrated device is a Spatial Light Modulator (SLM).

In yet another embodiment of the invention said Spatial Light Modulator is a micromirror SLM.

In yet another embodiment of the invention said support structure is hollow with an open end, In yet another embodiment the invention further comprising the action of forming said support structure lithographically by patterning the intermediate bonding material prior to bonding.

In yet another embodiment of the invention said first substrate is at least partly prefabricated prior to bonding.

BRIEF DESCRIPTION OF THE DRAWINGS

For a more complete understanding of the present invention, and the advantages thereof, reference is now made to the following description taken in conjunction with the accompanying drawings, in which:

FIG. 7b illustrates a side view of a portion of a micromirror SLM shown in FIG. 7a.

DETAILED DESCRIPTION OF THE PREFERRED EMBODIMENTS

For the purpose of this application, the terms "wafer" and "substrate" are used interchangeably, the difference between them merely amounting to dimensions thereof.

"element" and "component" shall be taken to mean any structure that is provided as a subunit on a wafer or substrate, and can comprise entire devices, as well as details of such devices, even a single piece of a material.

The method according to the present invention is useful for the manufacturing of micro mirror Spatial Light Modulators. However, it would be applicable to a wide variety of thermal and non thermal detector and actuator devices, such as, but not limited to, quantum well detectors, pyroelectric detectors, bolometers, optical switches, RF relays, etc. This method is particularly useful if the structure provided on said substrate, is temperature sensitive to the process temperature for the processing of the structure to be provided thereon or sensitive to other process parameters, such as when the substrate is poly crystalline and the elements that are to be grown on top of the substrate have to be mono crystalline.

FIG. 1 illustrates schematically a first process step according to an embodiment of the invention. A first substrate 100 is to be integrated with a second substrate 200. Said first substrate may be used for producing/forming components, e.g., at least one micro mirror or some other type of component(s) for example an electrical/ mechanical/optical component, after said first and second substrates have been joined together.

A second wafer 200, having steering electronics (and/or other types of circuitry) is manufactured by some standard type and cost efficient process, such as those methods commonly employed in Application Specific Integrated circuit (ASIC) production, or in "IC" foundries.

On said second substrate there may be provided electrodes 210 connectable to said steering electronics.

The first substrate 100 may for instance be made of some semi conducting material e.g. silicon, AlGaAs, InP, SiC, SiN, a metal or any other material such as a dielectric material, including but not limited to glass, quartz, silicon carbide, silicon nitride or diamond. Said material may be a single crystal material. Materials may be selected for the best possible performance (selectivity, response times, life span requirements etc.).

Figure 1A:
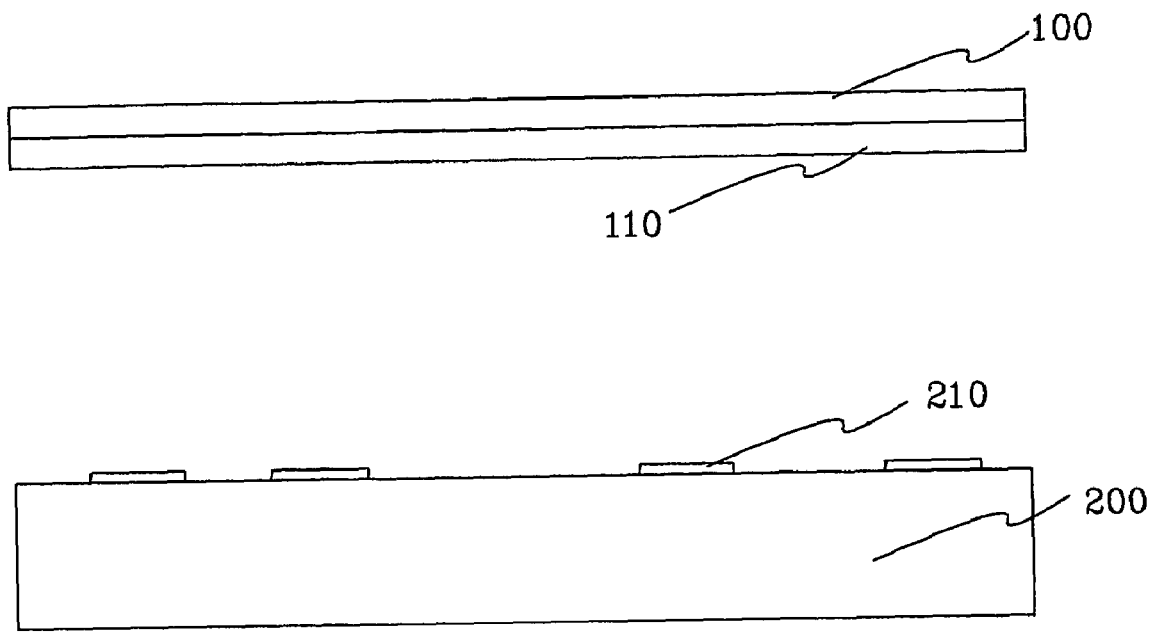
FIG. 1a illustrates a first example of a first process step according to an embodiment of the invention.

The first substrate 100, as illustrated in FIG. 1a, may be coated with a layer 110 of any type of material, such as silicon carbide, silicon nitride, silicon oxide, uncured or cured polymer such as epoxy, BCB (butylcyclobutene), benzocyclobutene, any photoresist, any polyimide, any low temperature adhesives or any thermoset materials in general, ceramic material.

Figure 1B:
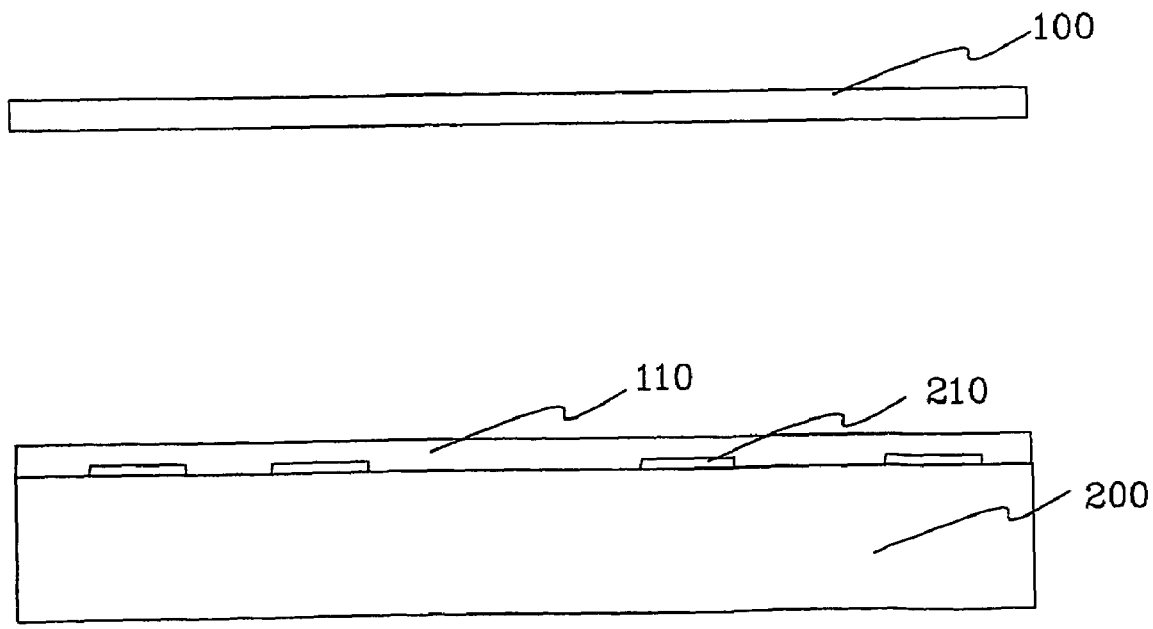
FIG. 1b illustrates a second example of a first process step according to an embodiment of the invention.
Figure 1C:
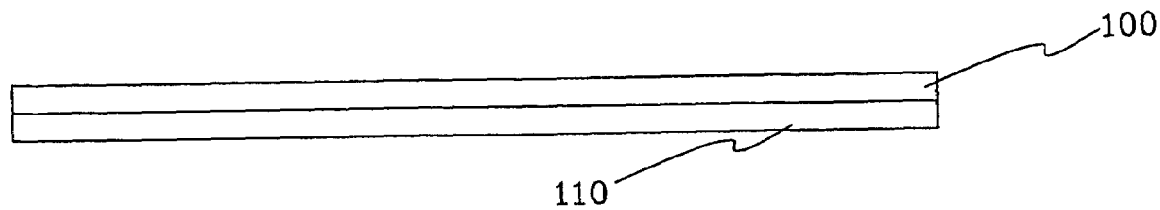
FIG. 1c illustrates a third example of a first process step according to an embodiment of the invention.
Figure 1C:
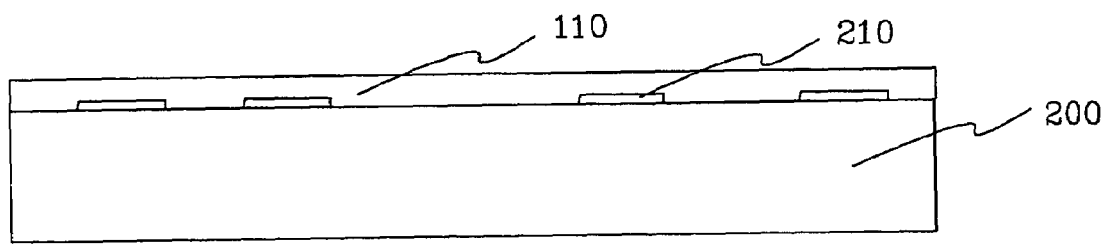

However, said second substrate 200 may be coated with said layer 110 as illustrated in FIG. 1b, either instead of coating said first substrate 100 or in addition to coating said first substrate 100 as illustrated in FIG. 1c. There might be different coatings on one or on both substrates 100, 200.

Adhesive materials, such as epoxy, BCB (butylcyclobutene), benzocyclobutene, any photoresist, any polyimide, any low temperature adhesives or any thermoset materials in general, may for instance be applied to said second substrate 200; to said first substrate 100; or to both said first substrate 200 and said second substrate 100, by spinning, i.e. rotating the substrate while applying the adhesive material or by capillary flow. In case of applying any other material silicon carbide, silicon nitride, silicon oxide, dielectric materials or any other similar or suitable material, said material might be applied using sputtering, plating, CVD, epitaxial growth or PVD preferably at low temperature.

Said layer 110 may be polished, lapped or etched for creating a smooth surface which will at least partially attach/bond to a sufficiently polished surface of said first substrate 100, said second substrate or the layer 110 applied to the other substrate. The better the surface uniformity and/or cleanness of said two surfaces the better they will attach/bond to each other. The bonding force will in this case be of the type of intermolecular forces such as Van der Waal forces. With activation procedures, such as plasma treatment, and/or cleaning procedures, such as argon atom bombardment in a vacuum used to remove adsorbed molecules from said surfaces, very strong bonding may be achieved.

Figure 2:
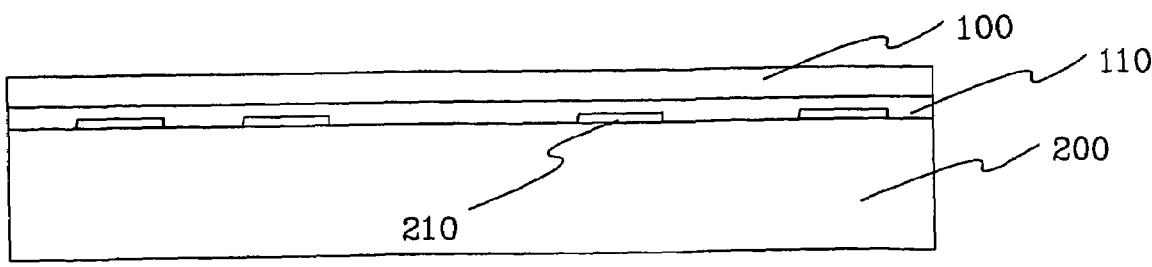
FIG. 2 illustrates a second process step according to an embodiment of the invention.
Figure 3:
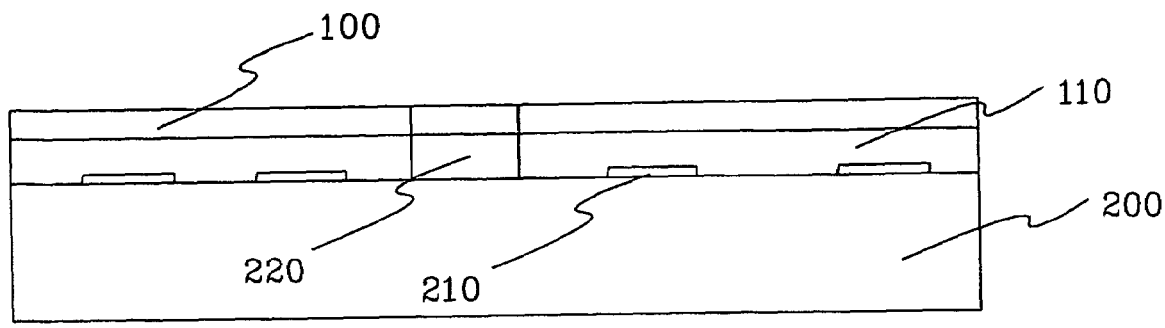
FIG. 3 illustrates a third process step according to an embodiment of the invention.

The first substrate 100 and the second substrate 200 may be joined together (bonded) under pressure or without pressure and preferably also with heating, FIG. 2. Before they are brought together said adhesive material may be procured at 60° C. for about 5 min. Thus, the first substrate 100 and the second substrate 200 will be bonded together by the polymer layer 110, that functions as an adhesive material. This procedure can be performed with standard equipment. For example may the two wafers may be bonded together with a bonding pressure of about 1 bar in a vacuum. While applying the pressure the temperature of the wafer is ramped up to for example 200° C. for two hours to cure the adhesive material.

Said first substrate 100 and said second substrate 200 may be joined by means other than the above described with intermolecular forces or adhesive bonding, such as by means of staples at the outer surface of said first 100 and second 200 substrates, glue at the edges of said first 100 and second 200 substrates, riveting, screws and bolts, etc.

The first substrate 100 may be covered with at least one metallization layer and/or at least one layer of another material (not shown) on at least one of its surfaces. If the optical properties of the material used in the first substrate 100 are not good enough, another material with better optical characteristics can be arranged on at least one of the surfaces of said first substrate. Said material may be sputtered, plated, deposited by means of Chemical Vapor Deposition (CVD) or Physical Vapor Deposition (PVD), or similar methods well known for a man skilled in the art onto said first substrate. A material with good optical characteristics is aluminum, at least from the point of view of reflectivity.

By choosing a predetermined thickness of said adhesive agent the distance between the first substrate 100 and the second substrate 200 can be controlled.

In order to form a pattern on the first substrate 100 a layer of photoresist is spun on top of the free surface of said first substrate, where said substrate may be covered with one or a plurality of additional layers of suitable material. By using well-known techniques of photolithography a desired pattern may be arranged in said layer of photoresist. By using an etching agent recommended for the used photoresist a well characterized pattern can be accomplished in said component material. A lift off technique may also be used to remove said material 110. Holes 220 in the first substrate and the adhesive agent are provided by means of wet etching, e.g. by using KOH, EDP, TMAH, and the skilled man will find suitable techniques using his ordinary knowledge. Dry etching of e.g. RIE type can also be used.

Figure 4:
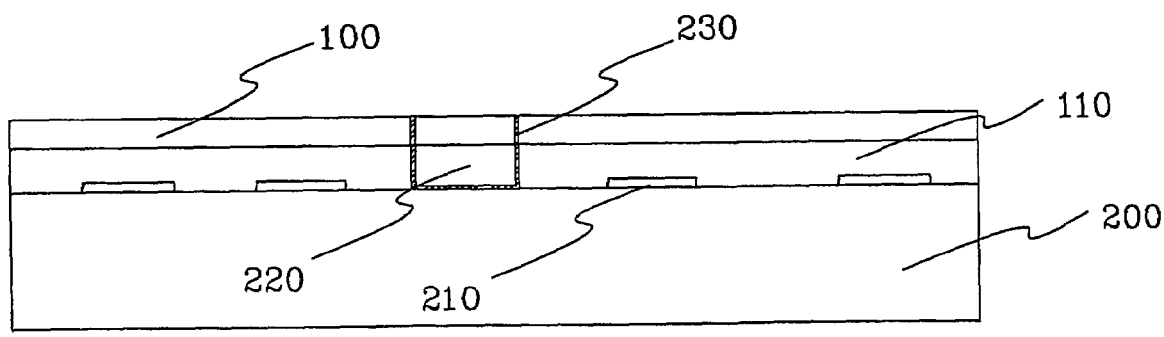
FIG. 4 illustrates a fourth process step according to an embodiment of the invention.
Figure 5:
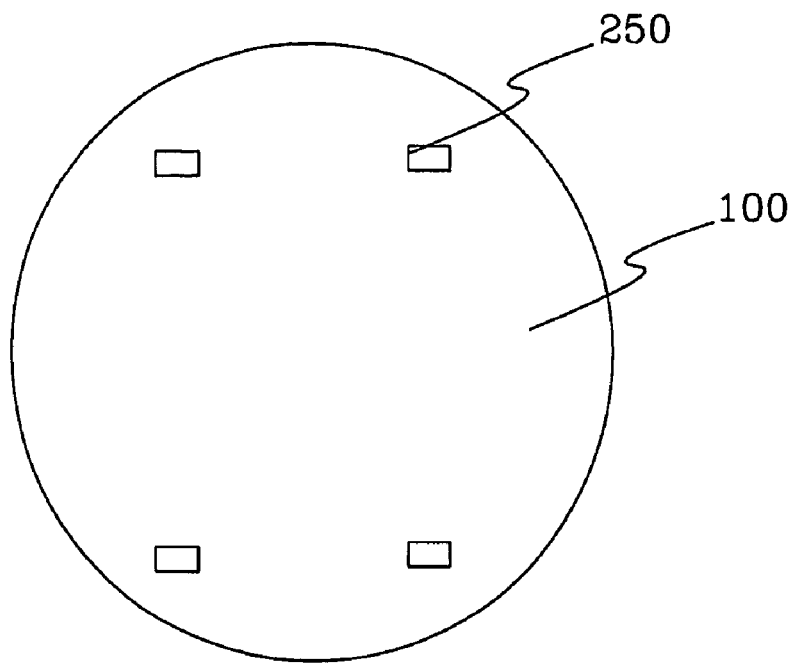
FIG. 5 illustrates a top view of a wafer comprising alignment holes.

The holes 220 are used for mechanically and/or electrically interconnecting said first substrate to said second substrate. This can be accomplished by applying an electrical conducting layer 230 inside of said hole 220 as illustrated in FIG. 4. Alternatively said hole may be filled with an electrically conducting material. Said layer or filled structure 230 provides for the functionality of a support structure and electrical/mechanical coupling between said first and second substrates.

The holes are provided at specific locations on top of said second substrate 200. Preferably said holes 220 are arranged on top of said second substrate 200 where said second substrate 200 is covered with an efficient etch stop layer, which in some cases, depending on the etching agent used, might be a metal. Alignment holes 250 may be used in order to align circuits arranged on said second substrate to the pattern to be printed on said first substrate. Said holes 250 are preferably somewhat larger than the underlying alignment marks provided on said second substrate.

Figure 6:
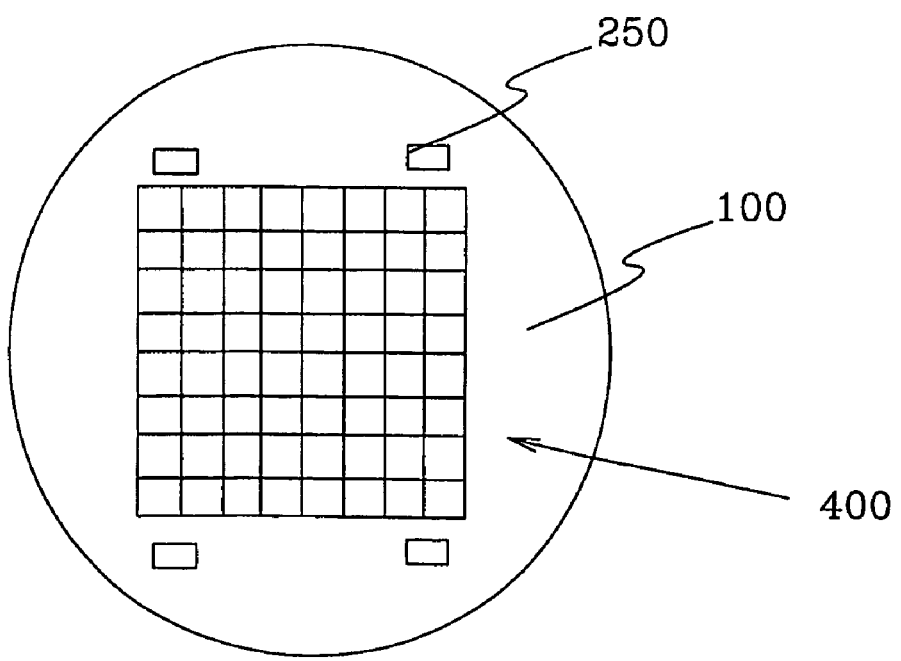
FIG. 6 illustrates a top view of a wafer comprising alignment holes and patterned elements.
Figure 7A:
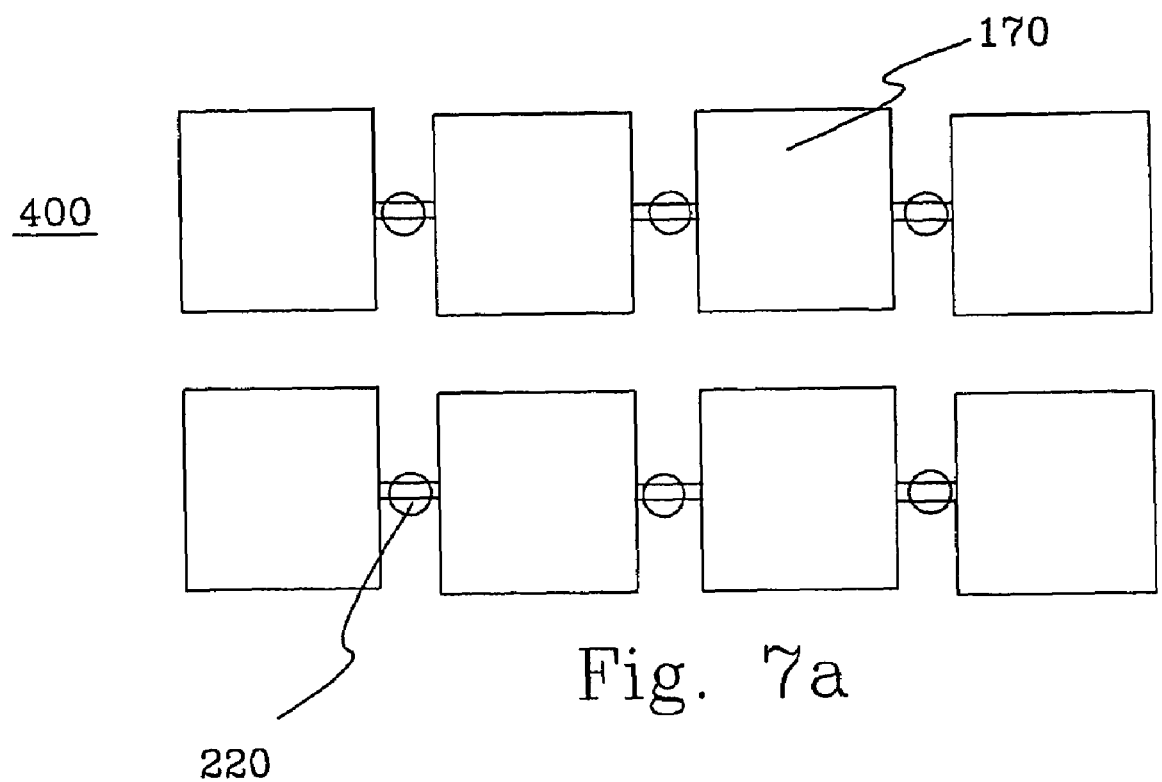
FIG. 7a illustrates a top view of a portion of modulating elements in an SLM.
Figure 7B:
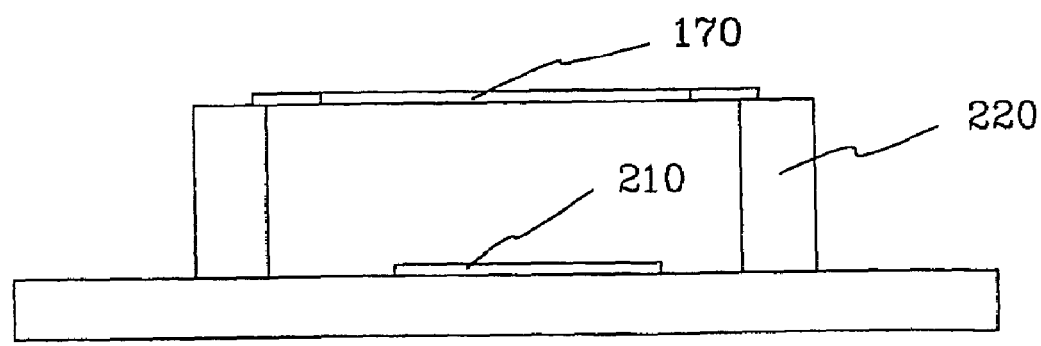

At least one element in said first substrate is to be connected to said second substrate 200. Said at least one element may for instance be a micro mirror array 400, FIG. 6, which is characterized by individually movable reflecting elements 170, see FIGS. 7a and 7b. Attached to said mirror elements are torsion or flexible elements 180 in the form of hinges. Said hinges is attached to said support structure 230. When applying a first voltage on an electrode 210 and a second voltage on the reflecting element 170 the potential difference will create an electrostatic attraction force, which will bend/move the reflecting element in a desired way.

Optionally the patterned element 170 may be further secured and interconnected to the second substrate by means of a method named micro riveting. Said interconnection can be performed with the help of the support structures 230, see FIG. 8. If the support structures 230 are made of electrically conducting material, or coated partly with a electrically conducting material, and the first substrate material above said support structure is provided with the hole 220, said metal riveting can be done by plating, sputtering or deposition etc.

Figure 8:
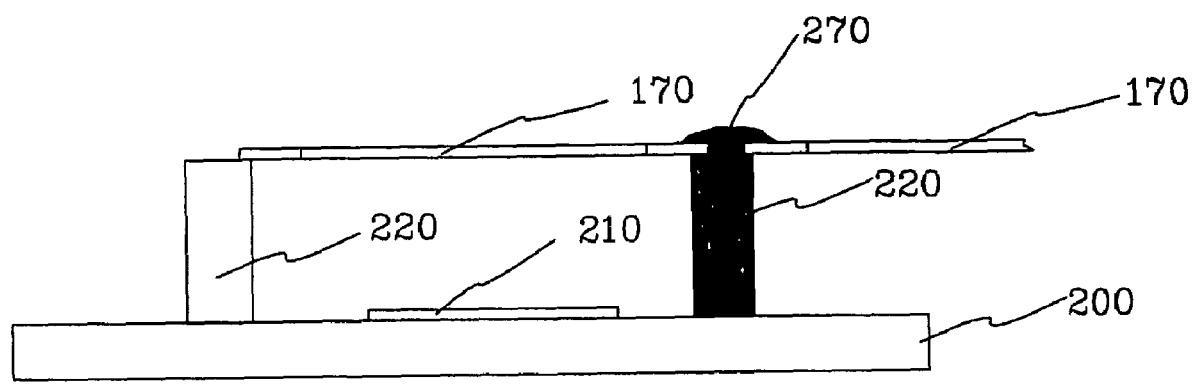
FIG. 8 illustrates a pair of micromirror elements secured to a support member by means of microriveting.

As can be seen in FIG. 8, the metal rivet 270 may extent outwardly from the surface of the component. Said outwardly extending part may be removed by polishing, lapping or similar methods.

The metal rivet 270 is not only forming an electrical connection between said circuitry in said second substrate 200 and said at least one element 170 in said first substrate 100 but also securing said element to said support structure 230. By having secured the element to said support structure it is safely to remove the bonding material 110 by for example an appropriate etching agent.

The outmost surface, which may be of semiconducting material, of the first substrate 100 may be doped. This doping makes the material electrically conducting.

The element or components 170 may have a layered structure of different materials. This layered structure functions as a stress compensation. One material may be silicon and the other material may be silicon nitride.

The elements, which are to be formed out of the first substrate, may partly or completely be pre patterned prior to bonding. For example SLM micro mirrors may be partially formed on said first substrate prior to bonding said first substrate with said second substrate.

Said first substrate may comprise alignment structures adapted in size and form to alignment structures in said second substrate. Said alignment structures may be self aligned by means of shaking said first and second substrates, i.e. passively aligned to each other.

Thus, although there has been disclosed to this point particular embodiments of the method of combining components to form an integrated device, it is not intended that such specific references be considered as limitations upon the scope of this invention except in-so-far as set forth in the following claims. Furthermore, having described the invention in connection with certain specific embodiments thereof, it is to be understood that further modifications may suggest themselves to those skilled in the art, it is intended to cover all such modifications as fall within the scope of the appended claims.

The invention claimed is:

1. A method to form an integrated device, said device comprising a first substrate and at least one element provided on a second substrate, comprising the actions of:
    arranging a layer of material on at least a portion of one of said substrates,
    joining said first and second substrates together,
    providing at least one recess through at least said first substrate and said material,
    providing support structures in at least a part of said at least one recess to mechanically and/or electrically interconnect said at least one element on said second substrate and said first substrate,
    forming at least one element out of said first substrate to be mechanically and/or electrically connectable to said at least one support structure
    stripping away at least a portion of said material between said first and second substrates to make said element on said first substrate movable.

2. The method according to claim 1, wherein said first and second substrates are joined together by means of at least one of the group of: bonding, riveting, bolted joint, external fixture, flip chip bonding, capillary wedge bonding, ultrasonic bonding.

3. The method according to claim 1, further comprising the action of:
   removing a portion of the thickness of the first substrate.

4. The method according to claim 1, further comprising the action of:
   arranging a metal layer on at least one surface of said first substrate prior to said joining.

5. The method according to claim 1, further comprising the action of:
   doping at least a portion of said first substrate made of semiconducting material prior to joining said first and second substrates together.

6. The method according to claim 1, further comprising the action of:
   providing at least one additional layer of stress compensating material on said first substrate.

7. The method according to claim 6, wherein said stress compensating material is at least one of the materials of: silicon oxide, silicon nitride, metal.

8. The method according to claim 1, wherein said support structure is made of electrically non conducting material.

9. The method according to claim 1, wherein said support structure is made of electrically conducting material.

10. The method according to claim 1, wherein said first substrate and said second substrate are secured to each other by one of the group of: evaporation, spin coating, sputtering, plating, riveting, soldering, gluing, Chemical Vapor Deposition, epitaxial growth, capillary flow.

11. The method according to claim 1, wherein said material is a low temperature adhesive, e.g. a polymer selected from poly-imide, bensocyclobutene (BCB), epoxy, photoresist.

12. The method according to claim 1, wherein said material is a metal, semiconducting or dielectric material.

13. The method according to claim 1, wherein said at least one element formed out of said first substrate is a micro mirror.

14. The method according to claim 1, wherein said at least one element formed out of said first substrate is made of a single crystal material.

15. The method according to claim 1, wherein said at least one element formed out of said first substrate is made of amorphous material.

16. The method according to claim 1, wherein said at least one element formed out of said first substrate is made of nanocrystalline material.

17. The method according to claim 14, wherein said material is semiconducting.

18. The method according to claim 1, wherein said at least one element provided on said second substrate is an integrated circuit.

19. The method according to claim 1, wherein said integrated device is a Spatial Light Modulator (SLM).

20. The method according to claim 19, wherein said Spatial Light Modulator is a micromirror SLM.

21. The method according to claim 1, wherein said support structure is hollow with an open end.

22. The method according to claim 1, wherein said first substrate is at least partly prefabricated prior to joining said first and second substrates.

23. The method according to claim 15, wherein said material is semiconducting.

24. The method according to claim 16, wherein said material is semiconducting.

* * * * *